(12) United States Patent
Lee et al.

(10) Patent No.: US 7,649,403 B2
(45) Date of Patent: Jan. 19, 2010

(54) INTERNAL VOLTAGE GENERATING CIRCUIT

(75) Inventors: Kang-Seol Lee, Ichon-shi (KR); Jae-Hyuk Im, Ichon-shi (KR)

(73) Assignee: Hynix Semiconductor, Inc., Gyeonggi-do (KR)

( * ) Notice: Subject to any disclaimer, the term of this patent is extended or adjusted under 35 U.S.C. 154(b) by 92 days.

(21) Appl. No.: 11/320,852

(22) Filed: Dec. 30, 2005

(65) Prior Publication Data

US 2006/0244517 A1 Nov. 2, 2006

(30) Foreign Application Priority Data

Apr. 30, 2005 (KR) ...................... 10-2005-0036564

(51) Int. Cl.
 G05F 1/10 (2006.01)
 G05F 3/02 (2006.01)
(52) U.S. Cl. ......................... 327/536; 363/60
(58) Field of Classification Search ................. 327/536, 327/537; 363/59–60
 See application file for complete search history.

(56) References Cited

U.S. PATENT DOCUMENTS

| | | | |
|---|---|---|---|
| 5,493,234 A | 2/1996 | Oh | |
| 6,097,428 A | 8/2000 | Wu et al. | |
| 6,150,860 A | 11/2000 | Chun | |
| 6,181,119 B1 | 1/2001 | Ikeda et al. | |
| 6,297,624 B1 | 10/2001 | Mitsui et al. | |
| 6,333,873 B1 | 12/2001 | Kumanoya et al. | |
| 6,373,322 B2 * | 4/2002 | Kobayashi et al. | 327/536 |
| 6,522,193 B2 | 2/2003 | Shin | |
| 6,724,242 B2 * | 4/2004 | Kim et al. | 327/536 |
| 6,762,640 B2 | 7/2004 | Katsuhisa | |
| 6,842,382 B2 | 1/2005 | Kim et al. | |
| 6,861,872 B2 | 3/2005 | Suh | |
| 7,292,090 B2 | 11/2007 | Lee et al. | |
| 2004/0017247 A1* | 1/2004 | Yasui et al. | 327/536 |
| 2004/0155701 A1 | 8/2004 | Kim et al. | |
| 2004/0232957 A1 | 11/2004 | Do | |

(Continued)

FOREIGN PATENT DOCUMENTS

JP 10-125097 5/1998

(Continued)

OTHER PUBLICATIONS

Korean Office Action issued in corresponding Korean Patent Application No. KR 10-2005-0036564, dated Sep. 28, 2006.

(Continued)

*Primary Examiner*—Lincoln Donovan
*Assistant Examiner*—Diana J Cheng
(74) *Attorney, Agent, or Firm*—IP & T Law Firm PLC

(57) ABSTRACT

There is an internal voltage generating circuit for providing a stable high voltage by making a response time short. The internal voltage generating circuit includes a charge pump unit for generate a high voltage being higher than an external voltage in response to pumping control signals and a supply driving control signal; a pumping control signal generating unit for outputting the pumping control signals to the charge pump unit based on a driving signal; and a supply driving control unit for receiving the driving signal to generate the supply driving control signal to the charge pump unit.

16 Claims, 11 Drawing Sheets

U.S. PATENT DOCUMENTS

2006/0145747 A1* 7/2006 Ucciardello et al. ......... 327/536
2006/0244515 A1 11/2006 Lee et al.

FOREIGN PATENT DOCUMENTS

| JP | 2003-86977 A | 3/2003 |
| KR | 2002-0007439 | 1/2002 |
| KR | 2002-0084892 | 11/2002 |
| KR | 10-2004-0102610 | 12/2004 |

OTHER PUBLICATIONS

United States Office Action issued in U.S. Appl. No. 11/905,530, dated on May 15, 2008.

* cited by examiner

INTERNAL VOLTAGE GENERATING CIRCUIT

FIELD OF THE INVENTION

The present invention relates to a semiconductor design technology; and, more particularly, to an internal voltage generating circuit for maintaining a stable high voltage level because of a fast response time.

DESCRIPTION OF RELATED ART

In semiconductor memory devices, an internal voltage generating circuit receives an external voltage VDD to generate various levels of an internal voltage.

With a low voltage and a low power consumption of the semiconductor memory devices, internal voltage generating circuits are increasingly employed in DRAMs.

Meanwhile, since the voltages used in the semiconductor memory devices are internally generated, many attempts have been made to generate stable internal voltages regardless of ambient temperature, process, or pressure.

FIG. 1 is a block diagram of a conventional internal voltage generating circuit.

Referring to FIG. 1, the conventional internal voltage generating circuit includes a level detector 10, an oscillator 20, a first pumping control signal generator 32, a second pumping control signal generator 34, a first charge pump 42, and a second charge pump 44. The first and second charge pumps 42 and 44 positively pump an external voltage VDD to generate a high voltage VPP higher than the external voltage VDD. The level detector 10 detects a level of the high voltage VPP. The oscillator 20 generates a periodic signal OSC in response to a detection signal PPE of the level detector 10. The first pumping control signal generator 32 generates a plurality of pumping control signals for controlling a driving of the first charge pump 42 in response to the periodic signal OSC. The second pumping control signal generator 34 generates a plurality of pumping control signals for controlling a driving of the second charge pump 44 in response to an inverted periodic signal.

In such an internal voltage generating circuit, when the level of the high voltage VPP decreases, its level decrease is detected through the level detector 10 and then the charge pumps 42 and 44 are driven by the oscillator 20 and the first and the second pumping control signal generators 32 and 34. Therefore, the high voltage VPP is maintained to a constant level.

FIG. 2 is a circuit diagram of the level detector 10 shown in FIG. 1.

Referring to FIG. 2, the level detector 10 includes a voltage divider 12 and a differential amplifier 14. The voltage divider 12 is configured with serially connected resistors to divide the high voltage VPP. The differential amplifier 14 amplifiers a level difference between an output voltage of the voltage divider 12 and a reference voltage VREF to output the detection signal PPE.

When the output voltage of the voltage divider 12 is lower than the reference voltage VREF, the level detector 10 outputs the detection signal PPE of a logic high level, and otherwise, the level detector 10 outputs the detection signal of a logic low level.

FIG. 3 is a circuit diagram of the oscillator 20 shown in FIG. 1.

The oscillator 20 includes a first inverter chain 22, a NAND gate ND1, and a second inverter chain 24.

The first inverter chain 22 delays and inverts the periodic signal OSC to generate a feedback periodic signal. The NAND gate ND1 receives the feedback periodic signal and the detection signal PPE. The second inverter chain 24 delays and inverts an output signal of the NAND gate ND1 to generate the periodic signal OSC.

The oscillator 20 is controlled by the detection signal PPE to generate the periodic signal OSC. That is, when the detection signal PPE is a logic high level, the oscillator 20 generates the periodic signal OSC that is toggled at a constant period. On the contrary, when the detection signal PPE is a logic low level, the oscillator 20 generates a logic low level signal as the periodic signal OSC.

FIG. 4 is a circuit diagram of the first pumping control signal generator 32 shown in FIG. 1.

Since the second pumping control signal generator 34 has the same circuit configuration as the first pumping control signal generator 32, the first pumping control signal generator 32 alone will be described below.

Referring to FIG. 4, the first pumping control signal generator 32 includes a first to a fourth delay units 32a, 32b, 32c and 32d, and a signal generating unit 32e.

The first to the fourth delay units 32a, 32b, 32c and 32d are connected in series to output delay periodic signals T1, T2, T3 and T4 by delaying a signal outputted from a previous stage of a corresponding delay unit. That is, the first delay unit 32a receives the periodic signal OSC to output the first delay periodic signal T1, and the second delay unit 32b delays an output of the first delay unit 32a to output the second delay periodic signal T2. The third delay unit 32c delays an output of the second delay unit 32b to output the third delay periodic signal T3. The fourth delay unit 32d delays an output of the third delay unit 32c to output the fourth delay periodic signal T4. The signal generating unit 32e receives the first to the fourth delay periodic signals T1, T2, T3 and T4 to output a plurality of pumping control signals OSC_T1, OSC_T2, OSCB_T1, OSCB_T2, PACP0, PCAP1 and PCAP2.

FIG. 5 is an operational waveform of the first pumping control signal generator 32 shown in FIG. 4.

Referring to FIG. 5, the first to the fourth delay units 32a, 32b, 32c and 32d generate the first to the fourth delay periodic signal T1, T2, T3 and T4 having a different delay time from the periodic signal OSC. The signal generating unit 32e generates a plurality of pumping control signals OSC_T1, OSC_T2, OSCB_T1, OSCB_T2, PCAP0, PCAP1 and PCAP2 through a logic combination of the first to the fourth delay periodic signals T1, T2, T3 and T4 so as to drive the first charge pump 42. Activation periods of the pumping control signals OSC_T1, OSC_T2, OSCB_T1, OSCB_T2, PCAP0, PCAP1 and PCAP2 are not overlapped with one another.

As described above, the first and the second pumping control signal generators 32 and 34 have the same circuit configuration, while the second pumping control signal generator 34 receives the inverted periodic signal. Accordingly, the second pumping control signal generator 34 generates a plurality of pumping control signals having a phase difference of 180° from the signals shown in FIG. 5.

FIG. 6 is a circuit diagram of the first charge pump 42 shown in FIG. 1.

The first and second charge pumps 42 and 44 have the same circuit configuration.

The first charge pump 42 generates the high voltage VPP by pumping the external voltage VDD in response to the pumping control signals OSC_T1, OSC_T2, OSCB_T1, OSCB_T2, PCAP0, PCAP1 and PCAP2. Therefore, detailed operations from a time point 'a' in FIG. 5 will be described below.

First, since the pumping control signal PCAP0 has a ground voltage VSS level of a logic low level, a node TRN_CTR0 is set to (VDD-Vt).

Then, when the pumping control signal PCAP0 changes to a VDD level of a logic high level, the node TRN_CTR0 is set to (2VDD-Vt) by a capacitor C1. Accordingly, NMOS transistors NM1, NM2 and NM3 are turned on in response to a voltage of the node TRN_CTR0, so that nodes BT1, T1B and TRN_CTR1 increase to the VDD level.

The pumping control signal OSC_T1 changes from the high level to the low level. An NMOS transistor NM4 is turned off in response to the pumping control signal OSC_T1, so that a node T1HB is opened from the ground voltage VSS supply.

The pumping control signal OSCB_T2 is set to a logic high level, so that a node T2HB is grounded with the ground voltage VSS supply. A node T2B is set to (VDD-Vt).

Then, the pumping control signal PCAP1 changes to a logic high level, so that the node BT1 increases to 2VDD.

Also, since the pumping control signal OSCB_T1 changes to a logic high level, the node T1B increases to 2VDD and thus an NMOS transistor NM5 and a PMOS transistor PM1 are turned on. Accordingly, the node TRN_CTR0 is set to the VDD level by the NMOS transistor NM5 and the node T1HB increases to 2VDD by the PMOS transistor PM1.

A capacitor C2 having one terminal connected to the node T1HB pumps the node TRN_CTR1 to 3VDD by 2VDD of the node T1HB. Therefore, the NMOS transistor NM6 is turned on in response to the voltage of the node TRN_CTR1, so that a level of the node BT2 is 2VDD equal to that of the node BT1.

Then, the pumping control signal OSCB_T2 changes to a logic low level. An NMOS transistor NM7 is turned off so that the node T2HB is opened from the ground voltage VSS supply. An NMOS transistor NM8 is turned on in response to the voltage of the node TRN_CTR1 and thus the node TRN_CTR2 increases to 2VDD.

Thereafter, the pumping control signal PCAP2 changes to a logic high level. A capacitor C3 having one terminal receiving the pumping control signal PCAP2 pumps the node BT2 to 3VDD.

The pumping control signal OSC_T2 changes to a logic high level. The node T2B increases to 2VDD by a capacitor C4 having one terminal receiving the pumping control signal OSC_T2. A level of the node T2HB is 2VDD equal to that of the node T2B by the PMOS transistor PM2 turned on in response to the increased level of the node T2B. Therefore, the node TRN_CTR2 is pumped to 4VDD by a capacitor C5 having one terminal receiving the voltage of the node T2HB.

Accordingly, an NMOS transistor NM9 is turned on in response to the voltage of the node TRN_CTR2, so that 3VDD at the node BT2 is outputted as the high voltage VPP.

As described above, the first charge pump 42 positively pumps the external voltage VDD three times in response to the pumping control signals OSC_T1, OSC_T2, OSCB_T1, OSCB_T2, PCAP0, PCAP1 and PCAP2, and then is outputted as the high voltage VPP.

The second charge pump 44 receives the signals from the second pumping control signal generator 34 that outputs the pumping control signals with a phase difference of 180° from the output signals of the first pumping control signal generator 32. Therefore, the first charge pump 42 supplies the high voltage while the first charge pump 42 is not driven.

Consequently, the high voltage VPP is alternately supplied from the first and second charge pumps 42 and 44.

In the operation of the internal voltage generating circuit, it is assumed that threshold voltages of the MOS transistors are Vt.

Meanwhile, the problem that the conventional internal voltage generating circuit cannot stably maintain the high voltage VPP will be described below with reference to FIG. 7.

Referring to FIG. 7, a large amount of a high voltage is dissipated in a memory region at a time point when a word line WL is activated and deactivated by an active command ACT and a precharge command PCG.

When the VPP level decreases lower than a reference voltage VREF, the conventional internal voltage generating circuit detects the decreased level to increase a supply of the high voltage VPP. Therefore, a response time becomes long and the VPP level is unstable.

As described above, the level of the high voltage is not maintained stably, and if the level of the high voltage changes depending on the internal operation, noise is generated in cell data when a semiconductor memory device uses the high voltage in the word line, reducing the operational reliability of the device.

SUMMARY OF THE INVENTION

It is, therefore, an object of the present invention to provide an internal voltage generating circuit for providing a stable high voltage by making a response time short.

In accordance with an aspect of the present invention, there is provided an internal voltage generating circuit including: a charge pump unit for generate a high voltage being higher than an external voltage in response to pumping control signals and a supply driving control signal; a pumping control signal generating unit for outputting the pumping control signals to the charge pump unit based on a driving signal; and a supply driving control unit for receiving the driving signal to generate the supply driving control signal to the charge pump unit.

In accordance with another aspect of the present invention, there is provided a semiconductor memory device for stably supplying a high voltage including: a charge pump unit for generating a high voltage being higher than an external voltage in response to pumping control signals and a supply driving control signal; an oscillator for generating a periodic signal in response to a driving signal, without detecting a level change of the high voltage; a pumping control signal generating unit for generating the pumping control signals for outputting the pumping control signals to the charge pump unit based on the periodic signal; and a supply driving control unit for receiving the periodic signal to generate the supply driving control signal to the charge pump unit.

BRIEF DESCRIPTION OF THE DRAWINGS

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 1:
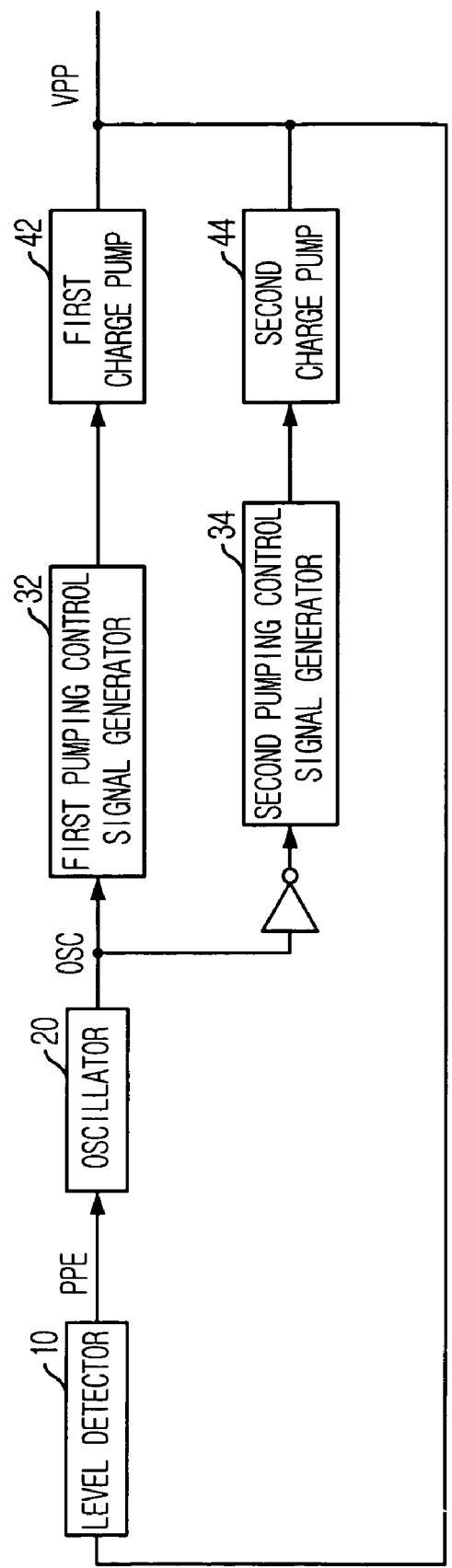
FIG. 1 is a block diagram of a conventional internal voltage generating circuit.
Figure 2:
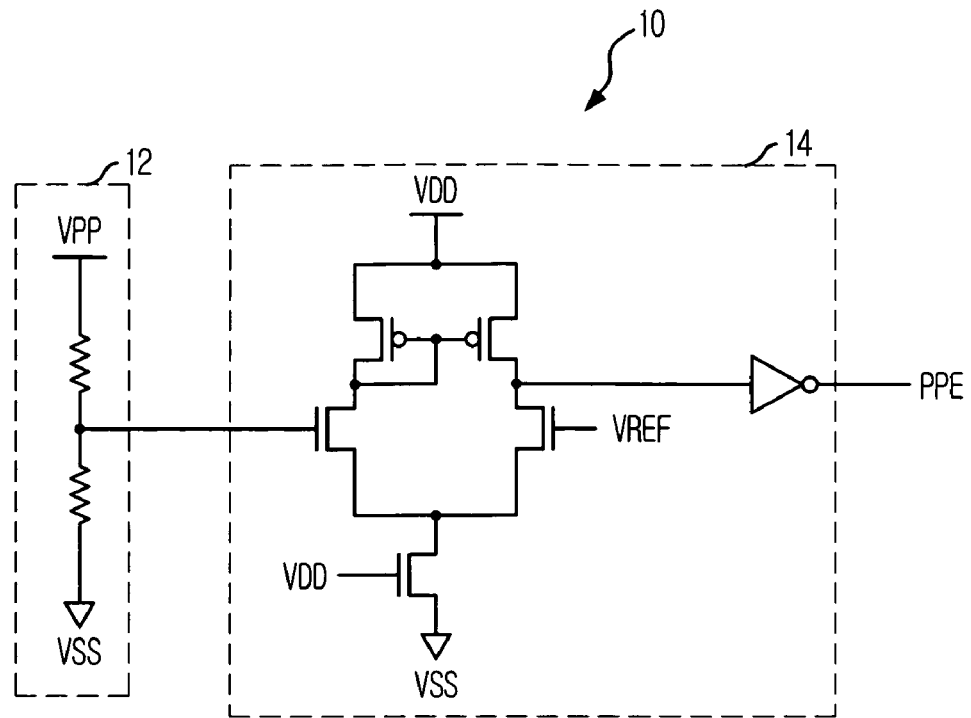
FIG. 2 is a circuit diagram of a level detector shown in FIG. 1.
Figure 3:
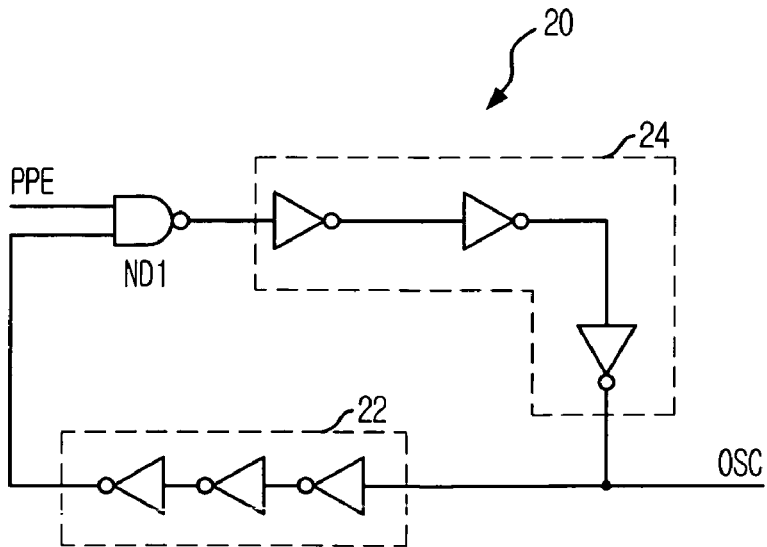
FIG. 3 is a circuit diagram of an oscillator shown in FIG. 1.
Figure 4:
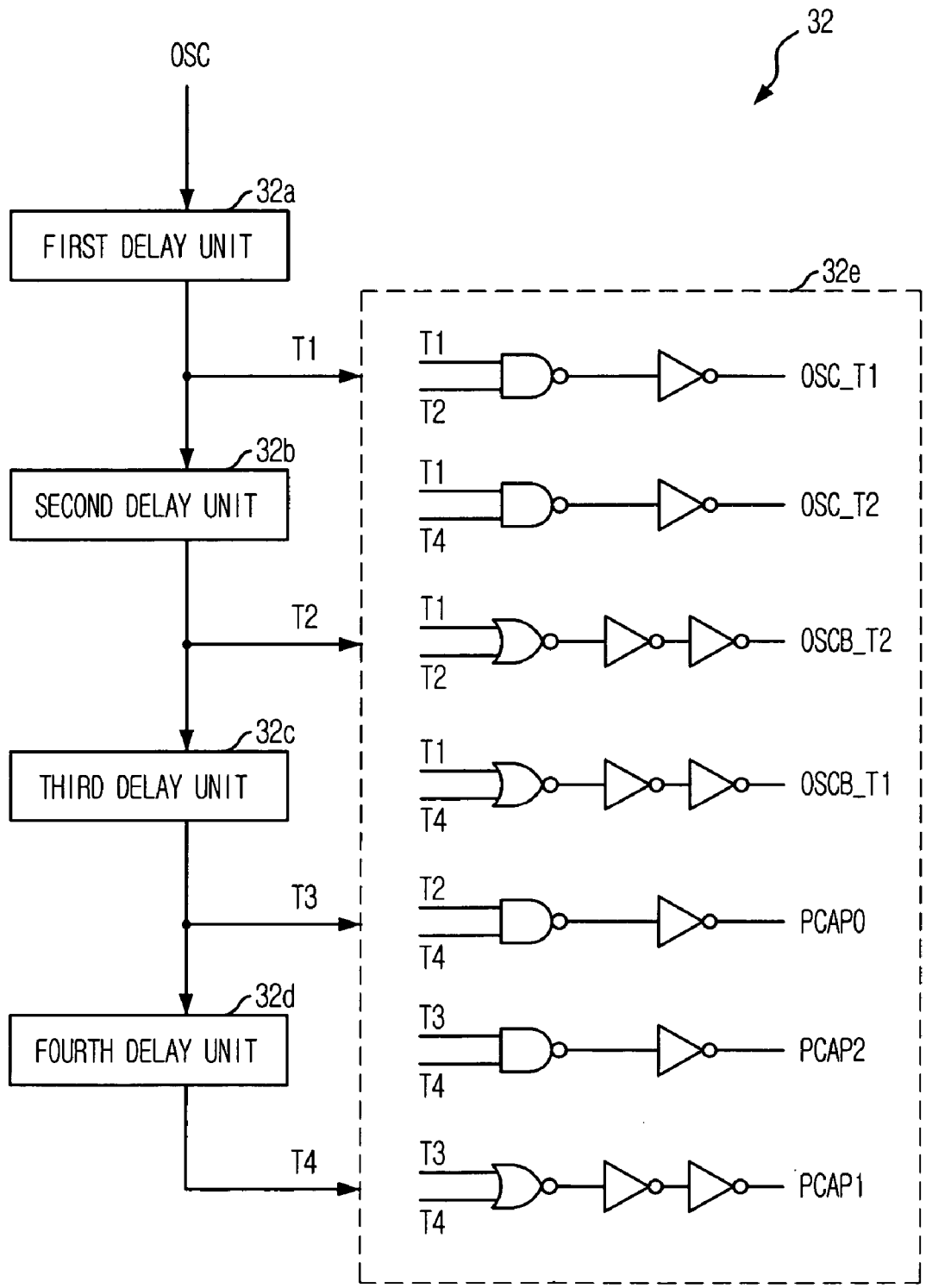
FIG. 4 is a circuit diagram of a first pumping control signal generator shown in FIG. 1.
Figure 5:
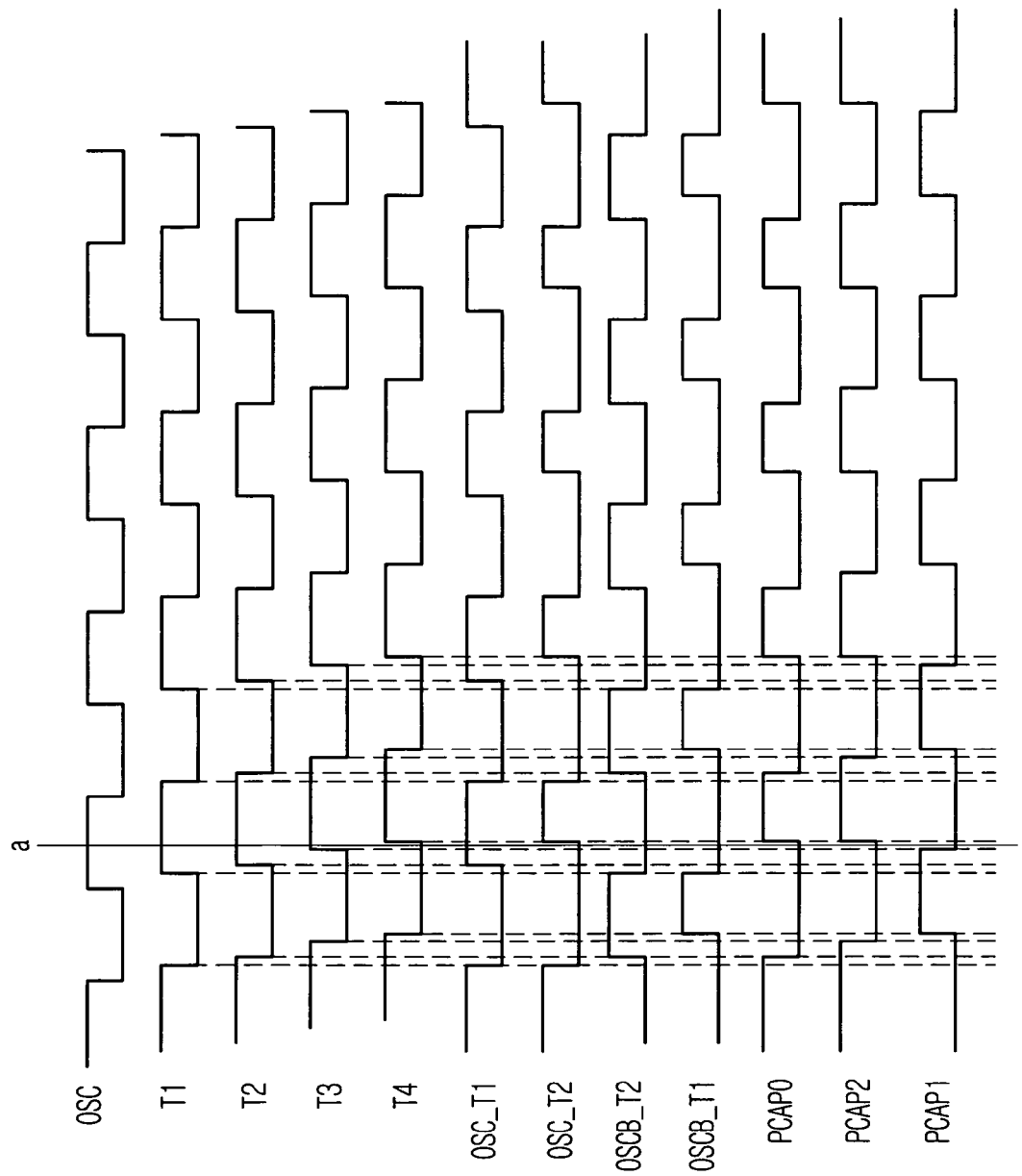
FIG. 5 is an operational waveform of the first pumping control signal generator shown in FIG. 4.
Figure 6:
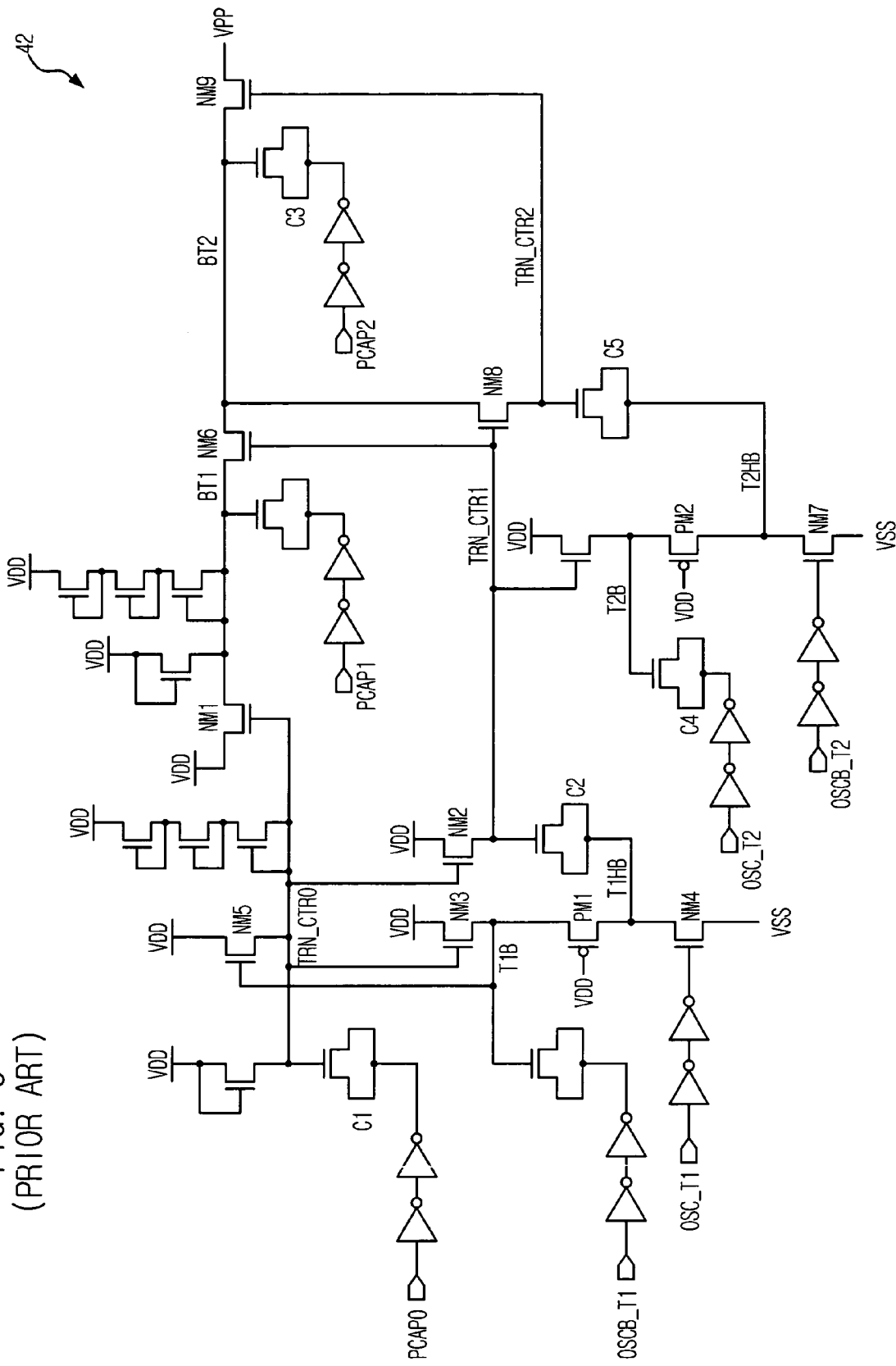
FIG. 6 is a circuit diagram of a first charge pump shown in FIG. 1.
Figure 7:
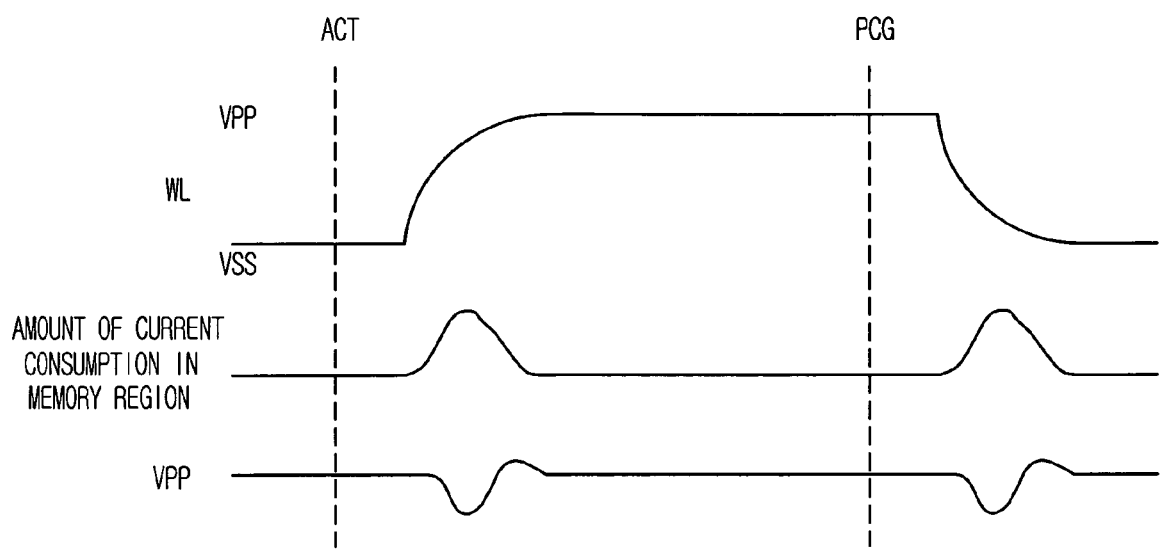
FIG. 7 is a graph for explaining problems of the conventional internal voltage generating circuit.
Figure 8:
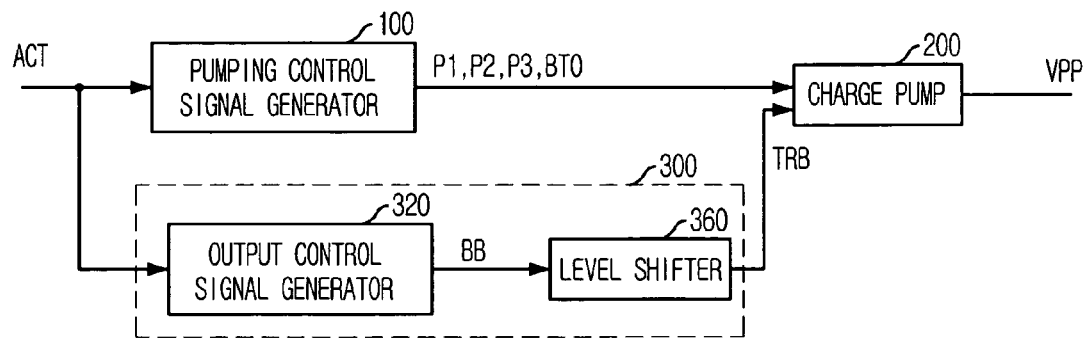
FIG. 8 is a block diagram of an internal voltage generating circuit in accordance with a first embodiment of the present invention.

FIG. 8 is a block diagram of an internal voltage generating circuit in accordance with a first embodiment of the present invention.

Referring to FIG. 8, the internal voltage generating circuit includes a pumping control signal generator 100, a charge pump 200, and a supply driving controller 300. The charge pump 200 positively pumps an external voltage VDD to generate a high voltage VPP higher than the VDD level. The pumping control signal generator 100 generates a plurality of pumping control signals for driving the charge pump 200 when an active command ACT is applied. The supply driving controller 300 receives the active command ACT and controls a supply of the high voltage VPP of the charge pump 200.

The supply driving controller 300 includes an output control signal generator 320 for receiving the active command ACT to generate an output control signal BB, and a level shifter 360 for shifting a level of the output control signal BB.

Also, the charge pump 200 includes a supply driver configured with PMOS transistors to supply the high voltage VPP.

In this embodiment, the internal voltage generating circuit positively pumps the external voltage VDD when the active command ACT is applied, and generates the high voltage VPP. That is, the internal voltage generating circuit supplies the high voltage VPP much more in response to the active command ACT, before a large amount of a current is rapidly dissipated in a memory region when the active command ACT is applied. Therefore, the level of the high voltage VPP can be maintained stably.

Figure 9:
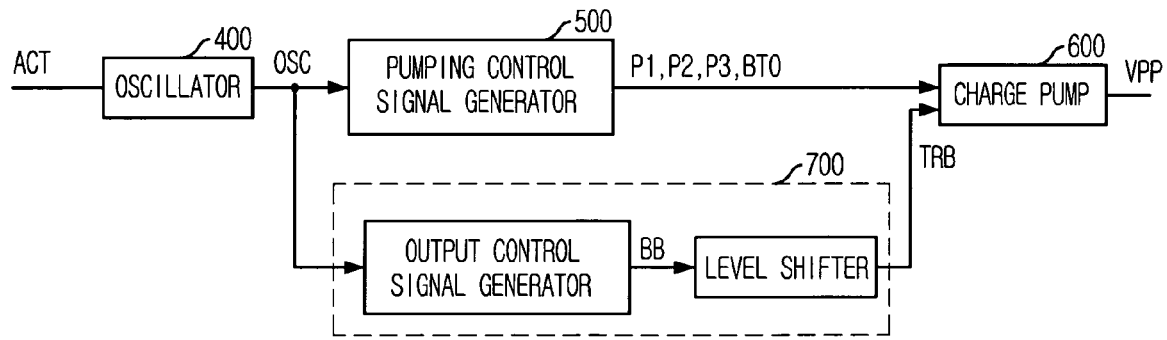
FIG. 9 is a block diagram of an internal voltage generating circuit in accordance with a second embodiment of the present invention.

FIG. 9 is a block diagram of an internal voltage generating circuit in accordance with a second embodiment of the present invention.

Referring to FIG. 9, the internal voltage generating circuit includes an oscillator 400, a pumping control signal generator 500, a charge pump 600, and a supply driving controller 700.

The charge pump 600 positively pumps an external voltage VDD to generate a high voltage VPP higher than the VDD level. The oscillator 400 generates a periodic signal OSC in response to an active command ACT. The pumping control signal generator 500 generates a plurality of pumping control signals P1, P2, P3 and BT0 for controlling a driving of the charge pump 600 in response to the periodic signal OSC. The supply driving controller 700 controls a supply of the high voltage VPP of the charge pump 600 in response to the periodic signal OSC.

Compared with the first embodiment shown in FIG. 8, the internal voltage generating circuit shown in FIG. 9 further includes the oscillator 400. When the active command ACT is applied, the oscillator 400 generates the periodic signal OSC for a predetermined time. The pumping control signal generator 500 and the supply driving controller 700 are driven in response to the periodic signal OSC. By controlling the period of the periodic signal OSC and the generating time of the period, the driving time of the charge pump 600 can be controlled.

In the case of the first embodiment, because the charge pump 200 is driven only when the active command ACT is applied, the internal voltage generating circuit in accordance with the first embodiment of the present invention can be used when the drivability is large enough to compensate for the internal current consumption. Also, the internal voltage generating circuit in accordance with the second embodiment of the present invention can be used by controlling the period of the periodic signal OSC according to an amount of the consumed high voltage VPP and a driving amount of the charge pump 600.

At this point, the active command ACT means a command that causes the elements to consume a large amount of the high voltage VPP. When the internal voltage generating circuit is used in the semiconductor memory device, the precharge command is also applied. Therefore, the internal voltage generating circuit can also be driven when the precharge command PCG is applied.

In the second embodiment, the only difference from the first embodiment is that the oscillator 400 is further provided. Therefore, the configuration and operation of the internal voltage generating circuit shown in FIG. 10 will be described below.

Figure 10:
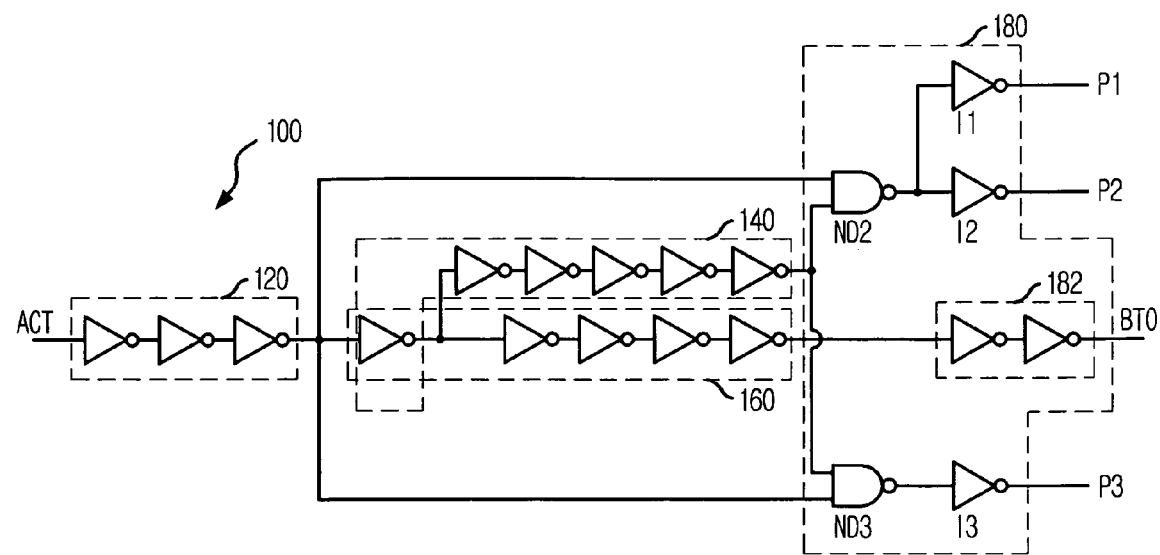
FIG. 10 is a circuit diagram of a pumping control signal generator shown in FIG. 8.

FIG. 10 is a circuit diagram of the pumping control signal generator 100 shown in FIG. 8.

Referring to FIG. 10, the pumping control signal generator 100 includes a first delay unit 120 for inverting and delaying the active command ACT to output a first delay signal, a second delay unit 140 for delaying the first delay signal to output a second delay signal, a third delay unit 160 for inverting and delaying the first delay signal to output a third delay signal, and a signal generating unit 180 for generating a plurality of pumping control signals P1, P2, P3 and BT0 for controlling a driving of the charge pump 200 through a logic combination of the first to the third delay signals.

The first delay unit 120 is an inverter chain configured with three inverters, the second delay unit 140 is an inverter chain configured with six inverters, and the third delay unit 160 is an inverter chain configured with five inverters.

The signal generating unit 180 includes a NAND gate ND2 receiving the first and the second delay signals, inverters I1 and I2 for inverting an output signal of the NAND gate ND2 to output the pumping control signals P1 and P2, a buffer 182 for buffering the third delay signal to output the pumping control signal BT0, a NAND gate ND3 receiving the first and second delay signals, and an inverter I3 for inverting an output signal of the NAND gate ND3 to output the pumping control signal P3.

When the active command ACT has a logic low level, the pumping control signal generator 100 outputs the pumping control signals P1, P2 and P3 of a logic high level and the pumping control signal BT0 of a logic low level.

Meanwhile, when the active command ACT has a logic high level, the pumping control signal generator 100 outputs the pumping control signal BT0 of a logic high level and the pumping control signals P1, P2 and P3 of a logic low level.

Figure 11A:
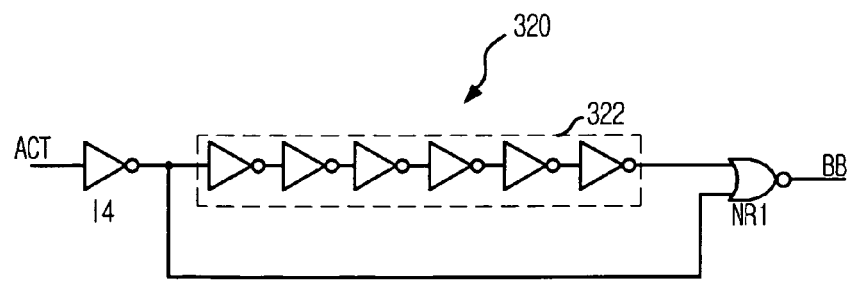
FIG. 11A is a circuit diagram of an output control signal generator shown in FIG. 8.

FIG. 11A is a circuit diagram of the output control signal generator 320.

Referring to FIG. 11A, the output control signal generator 320 includes an inverter I4 for inverting the active command ACT, a delay unit 322 for delaying an output signal of the inverter I4, and a NOR gate NR1 for receiving the output signals of the inverter I4 and the delay unit 322 to output the output control signal BB.

When the active command ACT is activated to a logic high level, the output control signal generator 320 activates the output control signal BB to a logic high level after a time delay of the delay unit 322. On the contrary, when the active command ACT is deactivated to a logic low level, the output control signal generator 320 activates the output control signal BB to a logic low level.

Figure 11B:
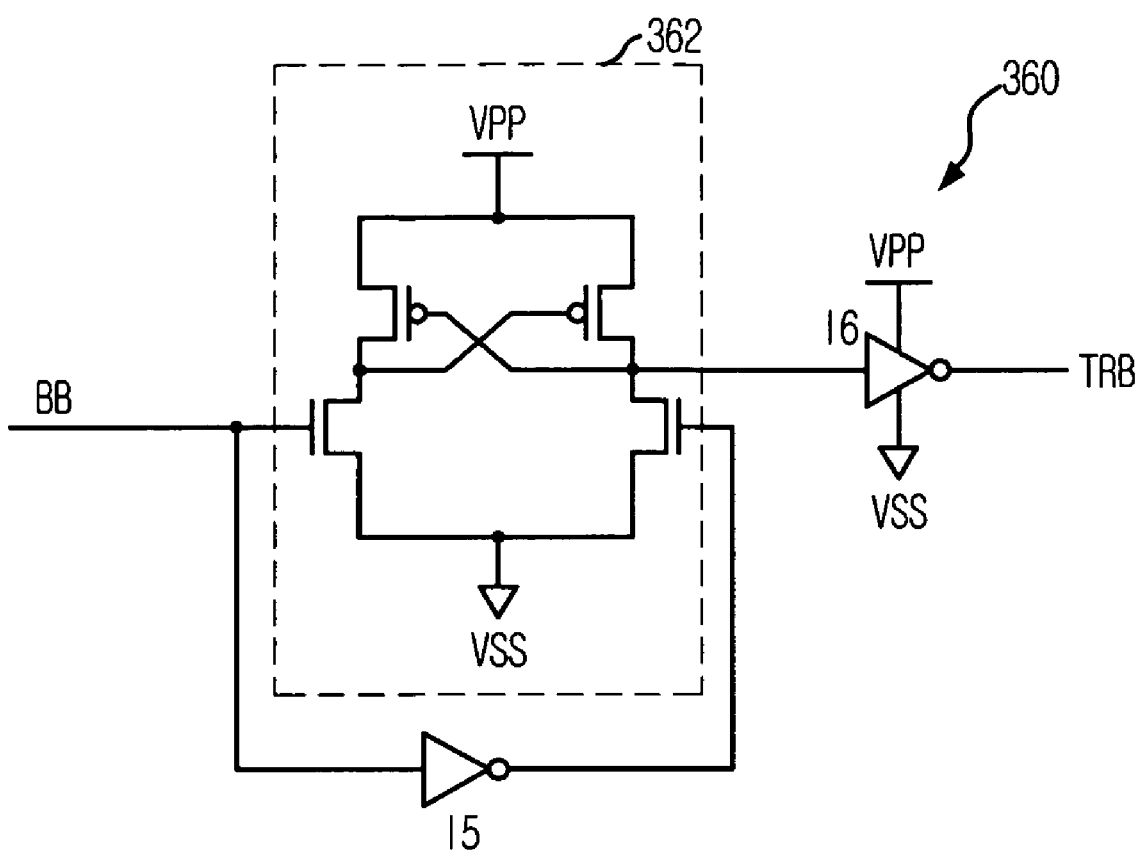
FIG. 11B is a circuit diagram of a level shifter shown in FIG. 8.

FIG. 11B is a circuit diagram of the level shifter 360 shown in FIG. 8.

Referring to FIG. 11B, the level shifter 360 includes an inverter I5 for inverting the output control signal BB, a differential amplifier 362 receiving the output control signal BB and an inverted output control signal, an inverter I6 for inverting an output signal of the differential amplifier 362 to output the supply driving control signal TRB having a swing width in the range from the high voltage VPP level to the ground voltage VSS level.

When the output control signal BB is a logic low level, the level shifter 360 outputs the supply driving control signal TRB of the VPP level, that is, the logic high level. When the output control signal BB is a logic high level, the level shifter 360 outputs the supply driving control signal TRB of the ground voltage VSS level, that is, the logic low level.

Figure 12:
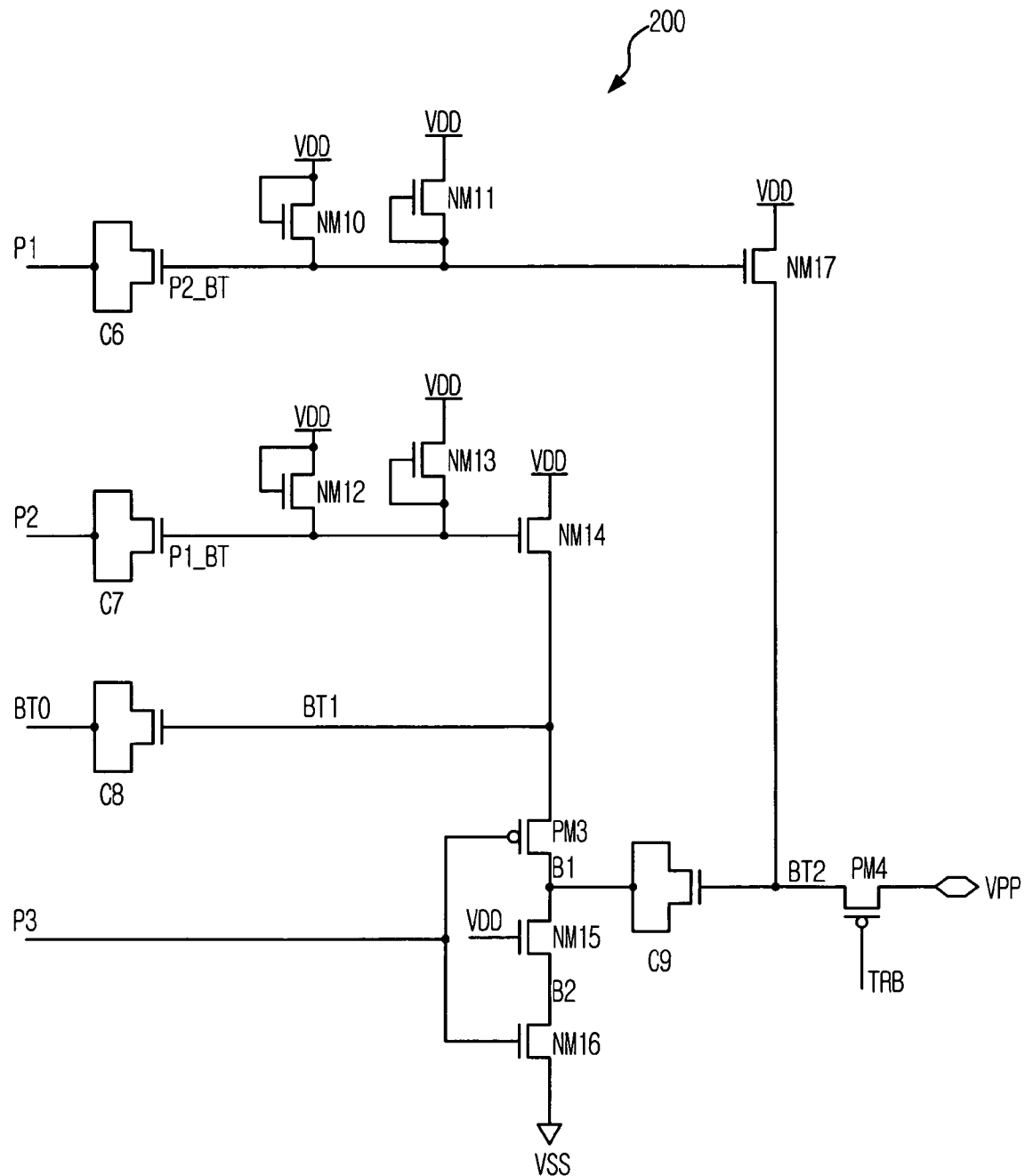
FIG. 12 is a circuit diagram of a charge pump shown in FIG. 8.

FIG. 12 is a circuit diagram of the charge pump 200 shown in FIG. 8.

Referring to FIG. 12, in the charging pump 220, a capacitor C6 has one terminal receiving the pumping control signal P1. An NMOS transistor NM10 has a drain and a gate connected to the external voltage VDD supply, and a source connected to the other terminal of the capacitor C6. An NMOS transistor NM11 has a drain connected to the external voltage VDD supply, and a source and a gate connected to the other terminal of the capacitor C6. A capacitor C7 has one terminal receiving the pumping control signal P2. An NMOS transistor NM12 has a drain and a gate connected to the external voltage VDD supply, and a source connected to the other terminal connected to the capacitor C7. An NMOS transistor NM13 has a drain connected to the external voltage VDD supply, and a source and a gate connected to the other terminal of the capacitor C7. A capacitor C8 has one terminal connected to the pumping control signal BT0. An NMOS transistor NM14 has a gate connected to the other terminal of the capacitor C7, and a drain-source path between the external voltage VDD supply and the other terminal of the capacitor C8. A PMOS transistor PM3 has a gate receiving the pumping control signal P3 and a source-drain path between the other terminal of the capacitor C8 and the node B1. An NMOS transistor NM15 has a gate connected to the external voltage VDD supply and a drain-source path between the node B1 and the node B2. An NMOS transistor NM16 has a gate receiving the pumping control signal P3 and a drain-source path between the node B2 and the ground voltage VSS supply. A capacitor C9 has one terminal connected to the node B1. An NMOS transistor NM17 has a gate connected to the other terminal of the capacitor C6 and a drain-source path between the external voltage VDD supply and the other terminal of the capacitor C9. A PMOS transistor PM4 has a gate receiving the supply driving control signal TRB and outputs a voltage of the other terminal of the capacitor C9 as the high voltage VPP.

An operation of the internal voltage generating circuit in accordance with the first embodiment of the present invention will be described below with reference to FIGS. 10 to 12.

First, when the active command ACT is not activated, the pumping control signal generator 100 outputs the pumping control signals P1, P2 and P3 of a logic high level and the pumping control signal BT0 of a logic low level in response to the periodic signal OSC. The supply driving controller 300 outputs the supply driving control signal TRB of a logic high level.

Accordingly, the NMOS transistors NM14 and NM17 of the charge pump 200 are turned on by the capacitors C6 and C7 receiving the pumping control signals P1 and P2, so that the nodes BT1 and BT2 are precharged to the VDD level. The PMOS transistor PM4 is turned off in response to the supply driving control signal TRB, so that the voltage of the node BT2 is not outputted as the high voltage VPP.

When the active command ACT is applied, the pumping control signal generator 100 changes the pumping control signal BT0 to a logic high level and the pumping control signals P1, P2 and P3 to a logic low level.

Thus, the NMOS transistors NM17 and NM14 are turned off by the capacitors C6 and C7 receiving the pumping control signals P1 and P2, so that the nodes BT1 and Bt2 are isolated from the VDD supply.

The node BT1 increases to 2VDD by the capacitor C8 receiving the pumping control signal BT0, and the PMOS transistor PM3 is turned on in response to the pumping control signal P3, so that the node B1 becomes 2VDD equal to that of the node BT1.

Accordingly, the node BT2 is pumped to 3VDD by the capacitor C9, one terminal of which is connected to the node B1. The PMOS transistor PM4 is turned on in response to the activated supply driving control signal TRB, so that 3VDD applied to the node BT2 is outputted as the high voltage VPP.

In the case of the internal voltage generating circuit in accordance with the second embodiment of the present invention, if the active command ACT is not applied, the oscillator 400 deactivates the periodic signal OSC to a logic low level. Thus, the pumping control signal generator 500, the supply driving controller 700, and the charge pump 600 are deactivated. When the active command ACT is applied, the oscillator 400 activates the periodic signal OSC to a logic high level. Therefore, the charge pump 600 outputs the high voltage VPP by pumping the external voltage VDD in response to the control signals P1, P2, P3, BT0 and TRB outputted from the activated pumping control signal generator 500 and the activated supply driving controller 700.

In the above operation, it is assumed that threshold voltages of the MOS transistors are Vt.

Figure 13:
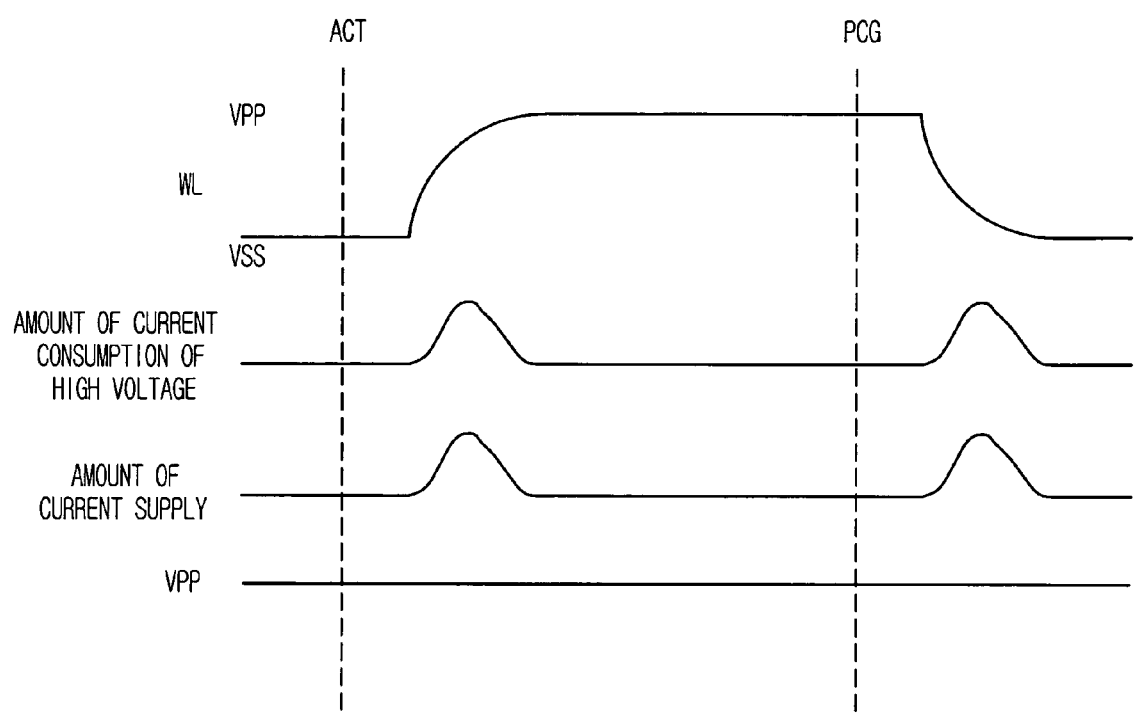
FIG. 13 is an operational waveform of the internal voltage generating circuit shown in FIG. 8.

FIG. 13 is an operational waveform of the internal voltage generating circuit shown in FIG. 8.

Referring to FIG. 13, a large of a current is dissipated in a memory region at a time point when a wordline WL is activated by the active command ACT, and a time point when a wordline WL is deactivated by a precharge command PCG.

As described above, since the high voltage VPP is supplied at the large drivability, the level of the high voltage VPP can be stably maintained.

Therefore, the internal voltage generating circuit supplies in advance the high voltage at the large drivability when applying the command causing a large current consumption inside the device. Thus, even when the current is substantially consumed by the command, the level of the high voltage can be stably maintained. Unlike the prior art in which the high voltage is supplied after the detection of the level decrease, an amount of a current supply is previously increased before the current is consumed, thus reducing the response time.

In addition, compared with the prior art, the internal voltage generating circuit in accordance with the present invention occupies a smaller area.

In the above embodiments, the active command is exemplarily described because the semiconductor memory device using the internal voltage generating circuit consumes a large amount of a current when the active command is applied. That is, other driving signals expected to consume a large amount of a current can be applied instead of the active command. Therefore, the present invention is not limited by the driving signal for driving the internal voltage generating circuit.

As described above, before a large amount of a current is consumed by the command, an amount of a current supply is increased. Therefore, the response time is reduced to thereby maintain a high voltage stably. In addition, the occupied area can be reduced.

The present application contains subject matter related to Korean patent application No. 2005-36564, filed in the Korean Intellectual Property Office on Apr. 30, 2005, the entire contents of which is incorporated herein by reference.

While the present invention has been described with respect to certain preferred embodiments, it will be apparent to those skilled in the art that various changes and modifications may be made without departing from the scope of the invention as defined in the following claims.

What is claimed is:

1. An internal voltage generating circuit for stably supplying a high voltage, comprising:
    a supply driving control unit for receiving a driving signal and generating a supply driving control signal in response to the received driving signal, wherein the supply driving control unit is controlled by the received driving signal;
    a pumping control signal generating unit for receiving the driving signal and outputting pumping control signals in response to only the received driving signal during an active mode, wherein the pumping control signal generating unit is controlled by only the received driving signal; and
    a charge pump unit for generating a high voltage being higher than an external voltage in response to the pumping control signals outputted from the pumping control signal generating unit and the supply driving control signal generated from the supply driving control unit,
    wherein the supply driving control unit includes:
        an output control signal generator for outputting its input signal as the output control signal for controlling an output time point of the charge pump unit; and
        a level shifter for shifting a level of the output control signal of the output control signal generator to output the supply driving control signal swing between a high voltage and a ground voltage,
    wherein the supply driving control signal of the supply driving control unit is not inputted to the pumping control signal generating unit,
    wherein the pumping control signal generating unit includes:
        a first delay unit for inverting and delaying an input signal to output a first delay signal:
        a second delay unit for delaying the first delay signal to output a second delay signal:
        a third delay unit for inverting and delaying the first delay signal to output a third delay signal: and
        a signal generating unit for generating the plurality of pumping control signals for controlling a driving of the charge pump unit through a logic combination of the first to the third delay signals,
    wherein the first delay unit is an inverter chain configured with three inverters. the second delay unit is an inverter chain configured with six inverters. and the third delay unit is an inverter chain configured with five inverters.

2. The internal voltage generating circuit as recited in claim 1, wherein the driving signal causes a current consumption of the high voltage within an external device.

3. The internal voltage generating circuit as recited in claim 2, wherein the charge pump unit includes a supply driver configured with a first PMOS transistor to supply the high voltage being higher than the external voltage under control of the supply driving control unit.

4. The internal voltage generating circuit as recited in claim 3, wherein the charge pump unit includes:
    a first capacitor having one terminal receiving a pumping control signal;
    a first NMOS transistor having a drain and a gate connected to an external voltage supply, and a source connected to the other terminal of the first capacitor;
    a second NMOS transistor having a drain connected to the external voltage supply, and a source and a gate connected to the other terminal of the first capacitor;
    a second capacitor having one terminal receiving a second pumping control signal;
    a third NMOS transistor having a drain and a gate connected to the external voltage supply, and a source connected to the other terminal connected to the second capacitor;
    a fourth NMOS transistor having a drain connected to the external voltage supply, and a source and a gate connected to the other terminal of the second capacitor;
    a third capacitor having one terminal connected to a third pumping control signal;
    a fifth NMOS transistor having a gate connected to the other terminal of the second capacitor and a drain-source path between the external voltage supply and the other terminal of the third capacitor;
    a second PMOS transistor having a gate receiving a fourth pumping control signal and a source-drain path between the other terminal of the third capacitor and a first node;
    a sixth NMOS transistor having a gate connected to the external voltage supply and a drain-source path between the first node and a second node;
    a seventh NMOS transistor having a gate receiving the fourth pumping control signal and a drain-source path between the second node and a ground voltage supply;
    a fourth capacitor having one terminal connected to the first node;
    an eighth NMOS transistor having a gate connected to the other terminal of the first capacitor and a drain-source path between the external voltage supply and the other terminal of the fourth capacitor; and
    a third PMOS transistor having a gate receiving the supply driving control signal to output a voltage of the other terminal of the fourth capacitor as the high voltage.

5. The internal voltage generating circuit as recited in claim 1, wherein the signal generating unit includes:
    a first NAND gate receiving the first and second delay signals;

a first and a second inverters for inverting an output signal of the first NAND gate to output the first and second pumping control signals, respectively;

a buffer for buffering the third delay signal to output the third pumping control signal;

a second NAND gate receiving the first and the second delay signals; and a third inverter for inverting an output signal of the second NAND gate to output the fourth pumping control signal.

6. The internal voltage generating circuit as recited in claim 5, wherein the output control signal generator includes:

a fourth inverter for inverting an input signal thereof;

a fourth delay unit for delaying an output signal of the second inverter; and a NOR gate for receiving the output signals of the fourth inverter and the fourth delay unit to output the output control signal.

7. The internal voltage generating circuit as recited in claim 6, wherein the level shifter includes:

a fifth inverter for inverting the output control signal;

a differential amplifier for receiving the output control signal and an inverted output control signal; and a sixth inverter for inverting an output signal of the differential amplifier to output the supply driving control signal swinging between the high voltage and the ground voltage supply.

8. A semiconductor memory device for stably supplying a high voltage, comprising:

an oscillator for generating a periodic signal in response to a driving signal, without detecting a level change of a high voltage being higher than an external voltage;

a pumping control signal generating unit for receiving only the periodic signal from the oscillator and generating pumping control signals in response to only the periodic signal during an active mode;

a supply driving control unit for receiving the periodic signal from the oscillator and generating a supply driving control signal in response to the periodic signal; and a charge pump unit for generating the high voltage being higher than the external voltage in response to the pumping control signals generated from the pumping control signal generating unit and the supply driving control signal generated from the supply driving control unit, wherein the supply driving control unit includes:

an output control signal generator for outputting its input signal as the output control signal for controlling an output time point of the charge pump unit; and a level shifter for shifting a level of the output control signal of the output control signal generator to output the supply driving control signal swing between a high voltage and a ground voltage, wherein the supply driving control signal of the supply driving control unit is not inputted to the pumping control signal generating unit.

9. The semiconductor memory device as recited in claim 8, wherein the driving signal causes a current consumption of the high voltage within an external device.

10. The semiconductor memory device as recited in claim 9, wherein the charge pump unit includes a supply driver configured with a first PMOS transistor to supply the high voltage being higher than the external voltage under control of the supply driving control unit.

11. The semiconductor memory device as recited in claim 10, wherein the charge pump unit includes:

a first capacitor having one terminal receiving a pumping control signal;

a first NMOS transistor having a drain and a gate connected to an external voltage supply, and a source connected to the other terminal of the first capacitor;

a second NMOS transistor having a drain connected to the external voltage supply, and a source and a gate connected to the other terminal of the first capacitor;

a second capacitor having one terminal receiving a second pumping control signal;

a third NMOS transistor having a drain and a gate connected to the external voltage supply, and a source connected to the other terminal connected to the second capacitor;

a fourth NMOS transistor having a drain connected to the external voltage supply, and a source and a gate connected to the other terminal of the second capacitor;

a third capacitor having one terminal connected to a third pumping control signal;

a fifth NMOS transistor having a gate connected to the other terminal of the second capacitor and a drain-source path between the external voltage supply and the other terminal of the third capacitor;

a second PMOS transistor having a gate receiving a fourth pumping control signal and a source-drain path between the other terminal of the third capacitor and a first node;

a sixth NMOS transistor having a gate connected to the external voltage supply and a drain-source path between the first node and a second node;

a seventh NMOS transistor having a gate receiving the fourth pumping control signal and a drain-source path between the second node and a ground voltage supply;

a fourth capacitor having one terminal connected to the first node;

an eighth NMOS transistor having a gate connected to the other terminal of the first capacitor and a drain-source path between the external voltage supply and the other terminal of the fourth capacitor; and a third PMOS transistor having a gate receiving the supply driving control signal to output a voltage of the other terminal of the fourth capacitor as the high voltage.

12. The semiconductor memory device as recited in claim 8, wherein the pumping control signal generating unit includes:

a first delay unit for inverting and delaying its input signal to output a first delay signal;

a second delay unit for delaying the first delay signal to output a second delay signal;

a third delay unit for inverting and delaying the first delay signal to output a third delay signal; and a signal generating unit for generating the plurality of pumping control signals for controlling a driving of the charge pump unit through a logic combination of the first to the third delay signals.

13. The semiconductor memory device as recited in claim 12, wherein the first delay unit is an inverter chain configured with three inverters, the second delay unit is an inverter chain configured with six inverters, and the third delay unit is an inverter chain configured with five inverters.

14. The semiconductor memory device as recited in claim 13, wherein the signal generating unit includes:

a first NAND gate receiving the first and the second delay signals;

a first and a second inverters for inverting an output signal of the first NAND gate to output the first and the second pumping control signals, respectively;

a buffer for buffering the third delay signal to output the third pumping control signal;

a second NAND gate receiving the first and second delay signals; and a third inverter for inverting an output signal of the second NAND gate to output the fourth pumping control signal.

15. The semiconductor memory device as recited in claim 14, wherein the output control signal generator includes:

a fourth inverter for inverting an input signal thereof;

a fourth delay unit for delaying an output signal of the second inverter; and a NOR gate for receiving the output signals of the fourth inverter and the fourth delay unit to output the output control signal.

16. The semiconductor memory device as recited in claim 15, wherein the level shifter includes:

a fifth inverter for inverting the output control signal;

a differential amplifier for receiving the output control signal and an inverted output control signal; and a sixth inverter for inverting an output signal of the differential amplifier to output the supply driving control signal swinging between the high voltage and the ground voltage supply.

* * * * *